United States Patent
Ruzic et al.

(10) Patent No.: US 7,528,386 B2
(45) Date of Patent: May 5, 2009

(54) SUBMICRON PARTICLE REMOVAL

(75) Inventors: David N. Ruzic, Sadorus, IL (US);
Brian E. Jurczyk, Champaign, IL (US);
Darren Alman, Savoy, IL (US); Martin J. Neumann, Pekin, IL (US); Huatan Qiu, Urbana, IL (US)

(73) Assignee: Board of Trustees of University of Illinois, Urbana, IL (US)

( * ) Notice: Subject to any disclaimer, the term of this patent is extended or adjusted under 35 U.S.C. 154(b) by 365 days.

(21) Appl. No.: 11/293,903

(22) Filed: Dec. 5, 2005

(65) Prior Publication Data
US 2006/0237667 A1  Oct. 26, 2006

Related U.S. Application Data

(60) Provisional application No. 60/673,639, filed on Apr. 21, 2005.

(51) Int. Cl.
*G21G 5/00* (2006.01)
(52) U.S. Cl. ............... 250/492.2; 250/492.1; 438/510; 156/345.47
(58) Field of Classification Search ............... 250/492.2
See application file for complete search history.

(56) References Cited

U.S. PATENT DOCUMENTS

| | | | |
|---|---|---|---|
| 3,730,873 A * | 5/1973 | Pompei et al. | 204/298.34 |
| 5,516,369 A | 5/1996 | Lur et al. | |
| 5,584,938 A | 12/1996 | Douglas | |
| 6,201,208 B1 * | 3/2001 | Wendt et al. | 219/121.41 |
| 6,391,118 B2 | 5/2002 | Fujii et al. | |
| 6,642,531 B1 * | 11/2003 | Powers | 250/492.2 |
| 2002/0154279 A1 * | 10/2002 | Koster et al. | 355/30 |
| 2005/0260354 A1 * | 11/2005 | Singh et al. | 427/523 |

OTHER PUBLICATIONS

I. Varghese, C. Cetinkaya, Non-Contact Removal of 60-nm Latex Particles from Silicon Wafers With Laser-Induced Plasma, *J. Adhesion Sci. Technol.*, vol. 18, No. 7, pp. 795-806 (2004).

A.A. Busnaina, J.G. Park, J.M. Lee, S.Y. Lou, Laser Shock Cleaning of Inorganic Micro and Nanoscale Particles, IEEE/SEMI *Advanced Manufacturing Conference*, p. 41-45 (2003).

Y. Momonoi, K. Yokogawa, M. Izawa, Dry Cleaning Technique for Particle Removal Based on Gas-Flow and Down-Flow Plasma, *J. Vac. Sci. Technol.*, vol. B22, p. 268-274 (2004).

L. Malter, *Thin Film Field Emission*, Phys. Rev. 49, p. 48-58 (1936).

(Continued)

*Primary Examiner*—David A. Vanore
*Assistant Examiner*—Phillip A. Johnston
(74) *Attorney, Agent, or Firm*—Brinks Hofer Gilson & Lione (57) ABSTRACT

A system for non-contact cleaning of particulate contamination of surfaces includes one or more sources that create a charge imbalance between a surface and particles that contaminate the surface, and a power supply that creates a pulsed electrical bias on the surface. This imbalance produces an electrostatic force that propels the particles off the surface. The cleaning process can be associated, for example, with microelectronic lithography and manufacturing.

19 Claims, 8 Drawing Sheets

OTHER PUBLICATIONS

W.K. Wong, JCH Phang, JTL Thong, *Imaging of Charging Specimens at High Beam Energies in the SEM*, IEEE—5th IPFA: Singapore, 55, (1995).

R.L. Kamocsai, W. Porod, *A Monte Carlo model of hot electron trapping and detrapping in SiO2*, J. Appl. Phys, 69, 2264-2275 (1991).

J. Cazaux, *Some Considerations on the Electric Field Induced in Insulators by Electron Bombardment*, J. Appl. Physics, 59, p. 1418-1430 (1986).

P. Mora, *Plasma Expansion into a Vacuum*, Phys. Rev. Letts, vol. 90, No. 18, p. 185002-1 to 185002-4 (2003).

E.V. Lopez, et al., *Origins of debris and mitigation through a secondary RF plasma system for discharge-produced EUV sources*, Microelectronic Engineering, 2005, 77: p. 95-102.

B.E. Jurczyk, et al., *Illinois debris-mitigation EUV applications laboratory*, Microelectronic Engineering, 2005 77: p. 103-109.

E.V. Lopez, et al., *Origins of debris and mitigation through a secondary RF plasma system for discharge-produced EUV sources*, Proceedings of SPIE vol. 5374, (2004) pp. 183-196.

\* cited by examiner

SUBMICRON PARTICLE REMOVAL

RELATED APPLICATION

This application claims the benefit of U.S. Provisional Application No. 60/673,639, filed Apr. 21, 2005, the entire contents of which are incorporated herein by reference.

BACKGROUND

This invention relates to surface cleaning of particulate contamination associated with microelectronic lithography and manufacturing.

A particular technological challenge for implementing microelectronic lithography and manufacturing is the particulate contamination of surfaces associated with certain processes. For example, although pellicles are employed to protect the masks in conventional lithography, pellicles are not sufficiently transparent for wavelengths produced with extreme UV (EUV) lithography. Hence, particles on these masks print every exposure in this type of lithography. Moreover, various processes associated with EUV have a tendency to generate particles that contaminate other surfaces, in addition to masks.

An example of an application to non-EUV lithography is nano-imprint lithography, which involves a mechanical process of pushing a UV-transmittable quartz mold into a thin film. When the mold is withdrawn, small amounts of contamination from the imprinted area may remain on the mold. When subsequent processing is performed with a contaminated mold, feature resolution decreases and there is potential for any film processed with the contaminated mold to be defective.

Particle production can be limited to a certain extent, but it is unreasonable to expect this production to go to zero. As such, mitigation schemes and cleaning protocols of the various surfaces have been proposed. However, conventional wet cleaning with typical chemicals attacks the sensitive surfaces and, hence, degrades these surfaces overtime and therefore is not compatible with EUV or other low critical dimension semiconductor manufacturing.

Recently, some research groups have proposed using laser-induced plasma cleaning systems to remove particulates from surfaces. In these systems, a laser scans across a surface and is focused near the particle to be removed such that breakdown of the gas occurs, resulting in a plasma. This plasma produces a shockwave that dislodges the particle. The shockwave, however, may damage the surface. Details of such systems are discussed in, for example, I. Varghese and C. Cetinkaya, *J. Adhesion Sci. Technol.*, vol. 18, p. 295 (2004) and A. A. Busnaina, J. G. Park, J. M. Lee, and S. Y. Lou, IEEEISEMI *Advanced Manufacturing Conference* p. 41 (2003), the entire contents of which are incorporated herein by reference.

Others have proposed using a plasma and gas flow based system to clean contaminated surfaces. This system generates reactive plasma that produces etching radicals, which reduces the adhesion force on the particles and the asperity height, which generally prevents rolling. A gas flow head is then moved across the surface to roll the particles off the surface. However, cleaning of patterned EUV masks is very difficult since rolling particles can fall into trenches or build up next to elevated features. Further details of such systems are described in Y. Momonoi, K. Yokogawa, M. Izawa, *J. Vac. Sci. Technol.* vol. B22, p. 268 (2004), the entire contents of which are incorporated herein by reference.

SUMMARY

Accordingly, in general, the present invention provides systems and methods for non-contact cleaning of particulate contamination of surfaces associated, for example, with microelectronic lithography and manufacturing. In one aspect, a system includes one or more sources that create a charge imbalance between a surface and particles that contaminate the surface with the possibility of a momentary electric field. This imbalance produces an electrostatic force that propels the particles off the surface. A power supply can be employed to produce a pulsed electrical bias to adjust the flux of electrons reaching the particles to control and optimize the rate at which the particles are charged.

In certain embodiments, Malter-effect-like damage to the surface can be controlled through the use of plasma. An electron beam gun may be used to emit electrons at the surface and particles to create the charge imbalance. Alternatively, a plasma source may be employed to create plasma that produces the charge imbalance between the surface and particles. The plasma may be pulsed to adjust the flux of electrons reaching the particles to control and optimize the rate at which the particles are charged.

Further features and advantages of the present invention will be apparent from the following description.

DETAILED DESCRIPTION

Figure 1:
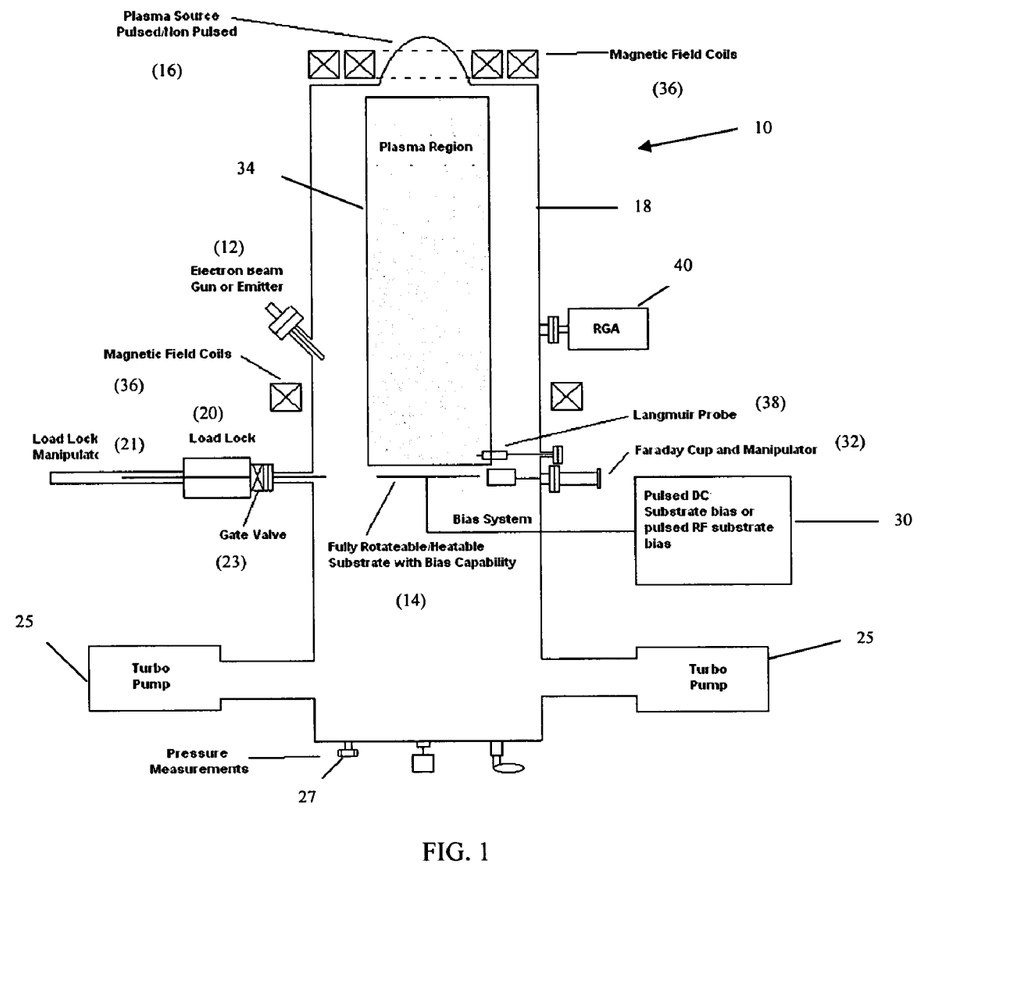
FIG. 1 depicts a system that cleans particulate contamination from a surface in accordance with the invention.

Referring now to FIG. 1, a system embodying the principles of the present invention is illustrated therein and designated at 10. As its primary components, the system 10 includes an electron beam gun or emitter 12, a sample holder 14, and a plasma source 16, all contained in a chamber 18.

The system 10 can be a stand alone system that cleans individual items, such as blank masks placed in the sample holder 14, or it can be integrated in a lithography system to clean patterned masks used, for example, in a stepper. Moreover, the system 10 can be integrated with the lithography system to clean the wafers during or between various steps of the lithography process.

To use the system 10, an item with a contaminated surface is placed in a load lock 20 and then positioned in the holder 14 by an individual operator using a load lock manipulator 21 or by a robotic mechanism. The position of the contaminated surface in the chamber 18 can be manipulated through the use of adjusters located on the side of the chamber 18. Moreover, the holder 14 can be heated and rotated about 360°. After the item is in position, a gate valve 23 is closed to seal the chamber 18, and turbo pumps 25 are turned on to create a vacuum in the chamber 18. Pressure measurements in the chamber 18 may be performed through the use of a pressure probe 27. The electron beam gun 12 is then operated to expose particles on the surface with electrons to create a charge imbalance between the particles and the surface. This imbalance produces an electrostatic force that propels the particles off the surface.

The system 10 may include a power supply and associated controller 30 connected to the isolated sample holder 14 to produce a pulsed electrical bias, such as a pulsed DC bias or RF bias, on the sample. The bias can be pulsed to adjust the flux of electrons reaching the particles and, hence, to control and optimize the rate at which the particles are charged.

The electron beam gun 12 may have a current density of between about 1 and 500 mA/cm² depending on the size of the particle being removed and the spot size of the beam desired. A current density of about 25 mA/cm² and a spot size of about 2 cm² are preferable. The system 10 may include a Faraday cup 32 and associated manipulator to measure the electron beam current. The electron beam gun 12 can produce a wide area beam to flood the surface with electrons, which affords a relatively quick and efficient method to effectively clean the entire surface. Alternatively, the electron beam gun 12 can produce a collimated beam that is steered to target specific areas of the surface. During the exposure of the particles and surface, the electron beam gun 12 can be turned on continuously, or, in some applications, intermittently. The cycle time the electron beam gun is turned on may be varied between about a few seconds to a couple of minutes. Thus, the electro beam gun 12 can be modulated in amplitude or time to produce staged levels of charge imbalance on the particles.

In addition, the pulse length of the electrical bias produced by the power supply and associated controller 30 can be varied from micro-seconds to milliseconds. A particular feature of the system 10 is that low currents and short pulse times can be used to first remove a particular size particle, and then the current or DC bias duration and pulse length can be varied to remove other size particles. Further, the overall time can be varied to remove each size of particle or composition class of materials in turn. Gas flow can also be present and can be varied in order to complement this effect and prevent particles from reattaching to the surface being cleaned. In certain implementations, the plasma source 16 produces plasma based on an inert gas, such as Ar or He, or H to mitigate sputtering damage to the surface. For example, the plasma may contact the particles and surface to reduce Malter-effect-like damage to the surface.

The plasma source 16 rather than the electron beam gun 12 may be used to produce plasma 34 to create the charge imbalance. The plasma source 16 may be operated continuously. Alternatively, the plasma source 16 may be pulsed. That is, the power supply for the plasma source 16 may be turned off and on, for example, under the direction of a controller, to control and optimize the rate at which the charge imbalance is created. The pulse length of the pulsed plasma can be varied from micro-seconds to milliseconds. A set of magnetic coils 36 may be employed to guide plasma 34 produced by the plasma source 16. A Langmuir probe 38 may be employed to determine properties of the plasma 34, such as its temperature and density.

In various implementations, the pulsed power supply and controller 30 or the pulsed power supply of the plasma source 16 can operate at a few hundred to about 200 kHz and can alter the pulsed waveform to get different charge rates and total charge delivered to the target. A rate of 50 kHz for about 3 minutes using a 50% duty cycle square wave pulse is preferable.

The system 10 may also include a gas supply and an associated controller to provide the flow of gas, such as Ar, across the surface to enhance the cleaning capabilities of the system 10, and a gas analyzer 40, such as a residual gas analyzer (RGA), to characterize the gasses in the chamber 18. Reactive gasses can also be used such as chlorine.

A particular feature of the system 10 is its ability to remove particulates on the submicron, in particular, the nanometer, scale that come to reside on the surfaces associated, for example, with EUV. To help understand this feature, the Van der Waals force, F, that holds a particle to the surface of the optic material is defined as:

$$F = 0.75 * \pi * W_A * D \quad (1)$$

where D is the diameter of the particle and $W_A$ is given by:

$$W_A = \frac{A}{12 * \pi * z_0^2} \quad (2)$$

where A is the Hamaker's constant and $z_0$ is the distance between the particle and the surface. Using polystyrene as an example, A is $12.2 \times 10^{-20}$ J and $z_0$ is approximately 4 Angstroms. Thus, for polystyrene particles with a diameter of about 200 nm, F≈10 nN.

The electrostatic force on the particle can be calculated from:

$$F = \frac{q_p^2}{4\pi\varepsilon_0 R^2} \quad (3)$$

Hence, by knowing the approximate particle size, and the previously calculated resultant Van der Waals force, the amount of electrostatic charge $q_p$, can be deduced. For a polystyrene particle with a diameter of about 200 nm, only 1600 elementary charges are needed for F=10 nN. Also, as R is reduced, $q_p$ is reduced proportionally, and there is, therefore, no theoretical minimum limit on the size of the particle removed.

Figure 2:
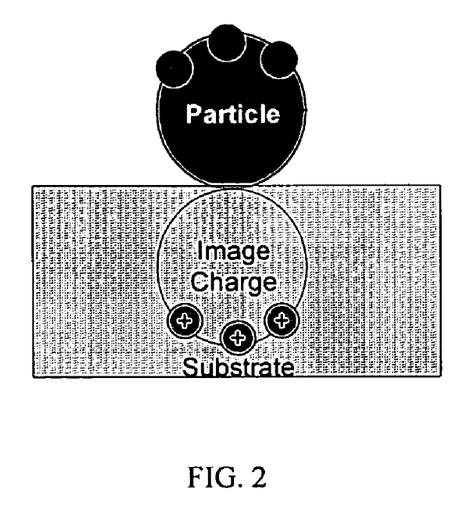
FIG. 2 depicts charge build up on a particle sitting on a substrate and the corresponding image charge.

When the system 10 is in use, charge is deposited onto contaminant particles as well as the substrate upon which the particles reside either by the broad beam electron gun or emitter 12 or through the use of plasma. When charge is first deposited on a non-conducting particle, an equal and opposite image charge is produced under the surface as shown in FIG. 2.

Figure 3:
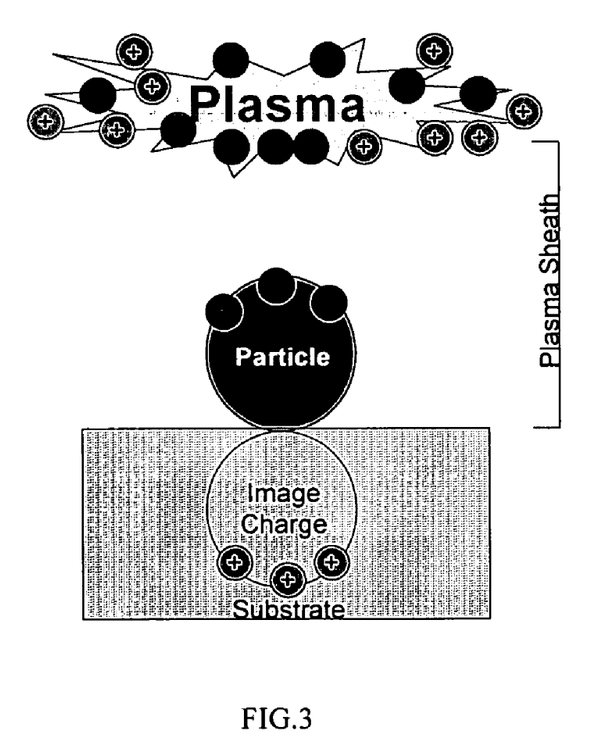
FIG. 3 depicts a plasma sheath established when plasma is used as an electron source to create charge imbalance between the particle and the substrate.

When charge is deposited by use of plasma, the ion flux to the surface of the substrate equals the ion flux attributable to electron repulsion in the plasma sheath as shown in FIG. 3. Most particles have sufficient conductivity to the substrate, and a charge balance is reached.

Figure 4:
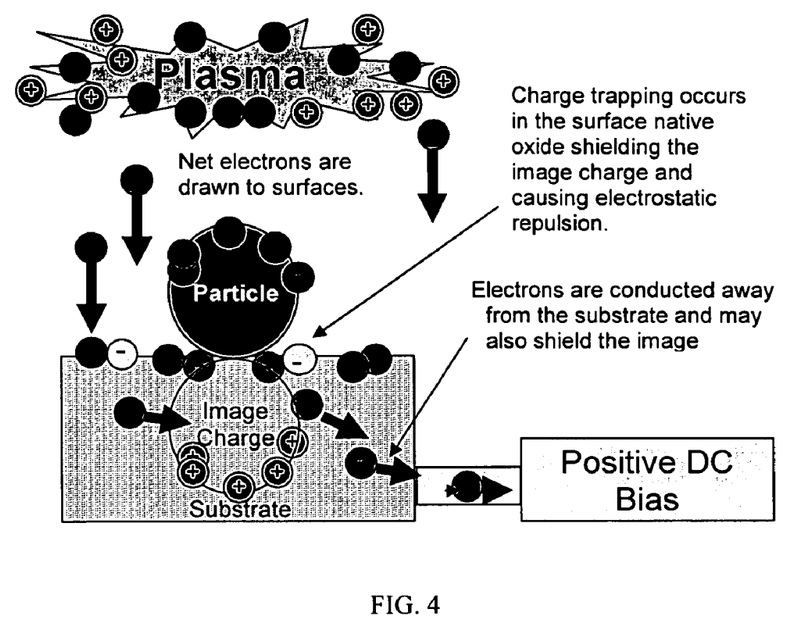
FIG. 4 depicts the effect of a positive DC bias on the substrate.

Adding a positive pulsed on non-pulsed bias to the surface has three effects: (1) it adds additional electrons to the particle, (2) it produces negative trapped charge, for example, in the $SiO_2$ native oxide on such a substrate surface thereby screening the original image charge, and (3) the moving charges themselves may screen the image charge. All three effects add to the electrostatic repulsion between the particle and substrate. FIG. 4 shows these effects with a plasma source used as the electron source. Note that the electron beam gun or emitter 12 produces the same response.

Figure 5:
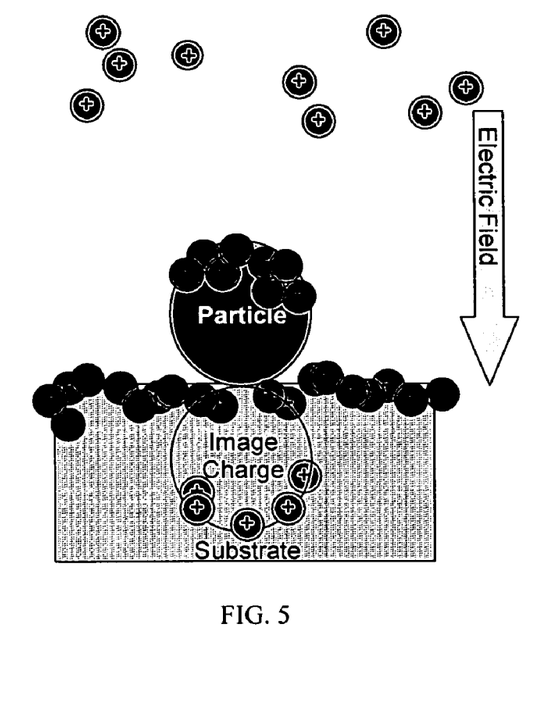
FIG. 5 depicts the induced electric field with a pulsed plasma to increase the electrostatic force for particle liberation.

This electrostatic repulsion can be further increased by pulsing the plasma. When the power input to the plasma is turned off, electrons quickly exit the plasma leaving the heavier ions behind. Therefore, the negative charge on the particle is momentarily increased again while an electric field is present. The plasma "afterglow" after the electrons have left the plasma and before the ions have recombined or hit the surface has the effect of being an electrostatic pump, as illustrated in FIG. 5.

The system 10 can be used to clean many types of surfaces. For example, in some applications, as described previously, the surfaces of mask blanks or patterned masks used in lithography processes may be cleaned with the system 10. The surfaces may be those of semi-conductor wafers. The mask or wafers may be charged in a vacuum chamber during the lithography process, or they may be charged during the process after removal from the vacuum chamber by, for example, a robot. The system 10 may be a standalone system, or one or more systems 10 may be integrated with a lithography system. The surfaces cleaned may be related to biochips. The surfaces may be associated with conductors, semi-conductors, or non-conductors. The system 10 may also be used in conjunction with imprint lithography. Other applications include cleaning MEMS and NEMS devices or any micro-tech or nano-tech structure or surface where particle removal and surface cleanliness is important.

EXAMPLE A

I. Experiment Setup

The system 10 was setup for non-contact cleaning of surfaces associated with EUV. Particle application was accomplished through the use of a diluted solution of ~220 nm diameter polystyrene nanoparticles suspended in isopropyl or methyl alcohol. The use of an alcohol minimizes the polarity of the solution, which can cause agglutination of particles on the surface of the sample during application. The alcohol solution is put into the reservoir of a commercial nebulizer. The nebulizer is used to transform a liquid solution into an aerosol solution by forcing compressed air into the reservoir. The force of the air is such that it breaks the liquid into tiny mist-like particles that consist of the alcohol and polystyrene particles in suspension. The entire nebulizer reservoir is immersed in an ultrasonic bath. Because of the size of the polystyrene nanoparticles, Van der Waals forces dominate and result in the particles self-agglutinating into clumps, which is undesirable since there is little clumping that occurs in EUV processes. The ultrasonic bath provides a mechanism to continuously overcome the Van der Waals forces and, therefore, to keep the particles in suspension. This provides a more uniform application of the solution on to the sample material and results in very little agglutination of the nanoparticles into clumps on the surface of the sample. The mist of the nebulizer is directed onto the sample at a specific distance and time that has been calibrated to yield a specific and repeatable particle density.

To quantify the non-contact cleaning of the samples, SEM analysis of the various samples were performed in conjunction with the use of a commercial statistical analysis program, Image J, by W. S. Rasband, at the National Institutes of Health in Bethesda, Ma., to yield an average number of particles per square micron. This begins by starting with a standard SEM picture and removing the grey background. A region is then selected and the non-black and black pixels are counted. In the SEM picture, the black or darker pixels correspond to something that is lower in height or level than a lighter pixel. Thus, particles on the surface show up as white dots, which is the basis behind determining how to count particles and pixels. This procedure was performed several times on the same sample at various locations to provide a statistical average.

II. Experiment

The samples used for this investigation were bare (1,1,1) Si wafer samples with an area of about 1 $cm^2$. Using (1,1,1) Si wafers are a viable test standard to investigate non-contact cleaning of contaminants and to develop optimal protocols before running experiments with other more expensive materials.

Figure 6:
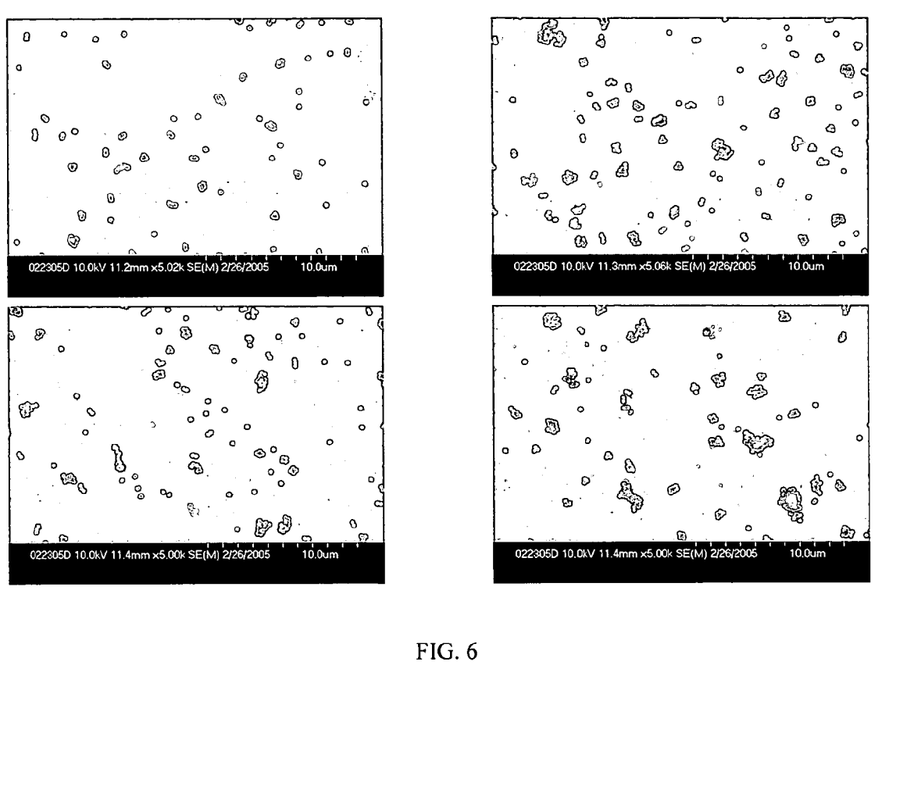
FIG. 6 shows SEM images of silicon wafers contaminated with polystyrene particles.

Si samples were nebulized with ~220 nm particles to provide a coverage of 0.46±0.25 particles per square micron, as shown in FIG. 6. This was the control measurement to which subsequent "cleaned" samples were compared. While holding the sample at ground potential in vacuum, a broad base electron beam at 200 eV with a current of 65 mA was applied for 60 secs, producing the results (0.092±0.074 particles per square micron) shown in FIG. 7. Another sample was also put in vacuum and a pulsed DC bias of ~200 V at 50 kHz and a broad electron beam with the same characteristics were applied, producing the results (0.50±0.21 particles per square micron) shown in FIG. 8.

III. Results

Figure 7:
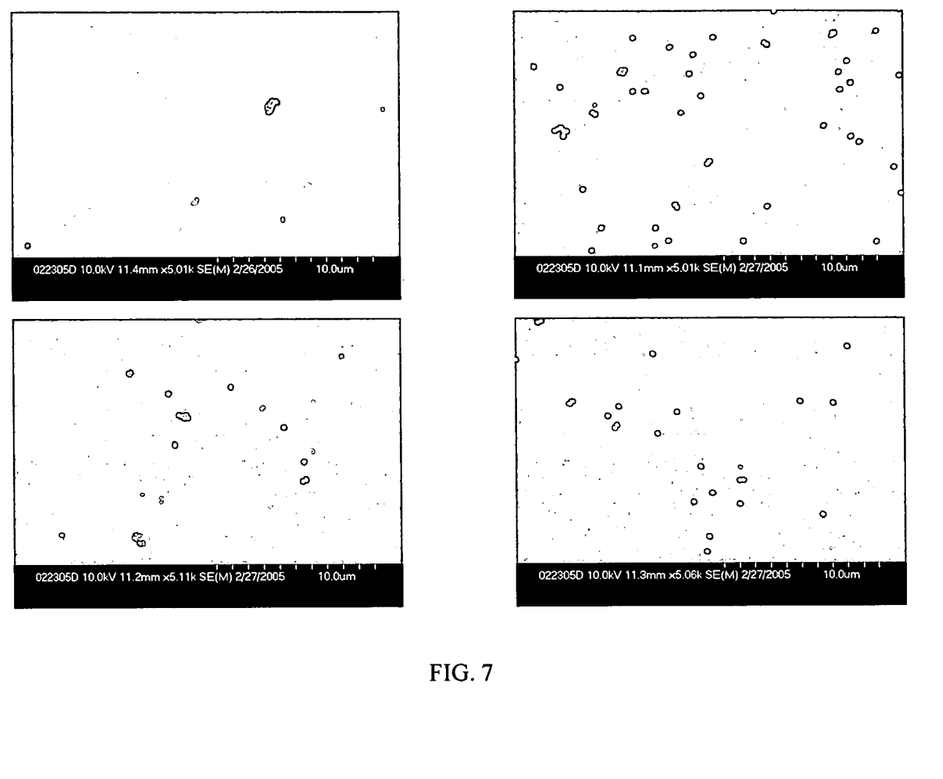
FIG. 7 shows SEM images of the silicon wafers after exposure to an electron beam.
Figure 8:
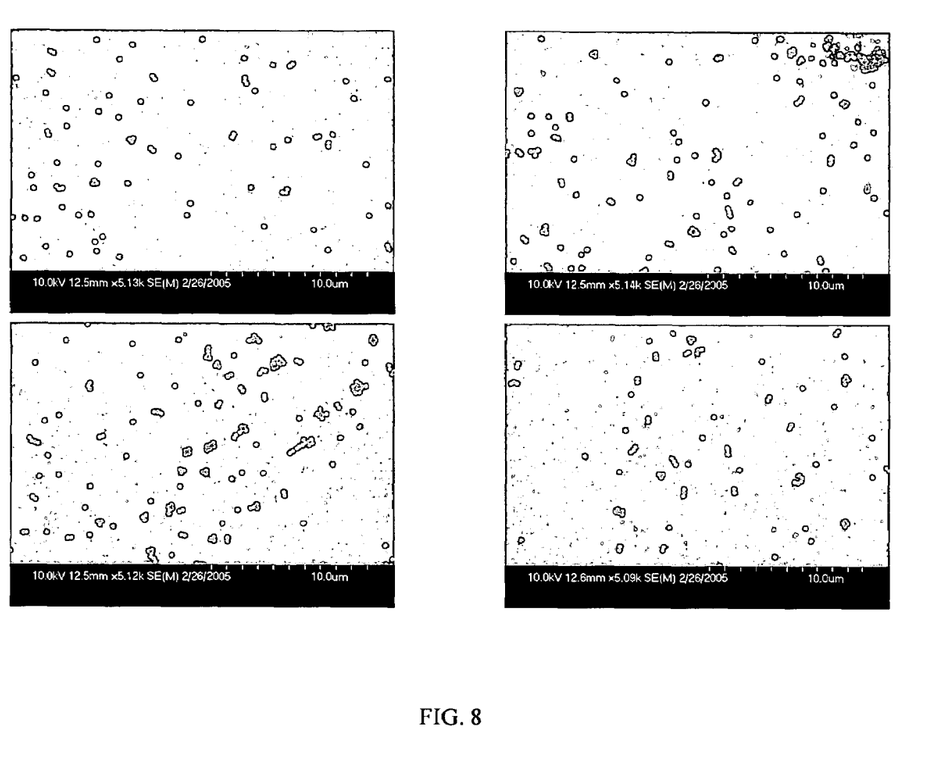
FIG. 8 shows SEM images of the silicon wafers after exposure to an electron beam and a pulsed DC bias.

In comparison to the original samples (FIG. 6), the application of a broad electron beam resulted in approximately 80% reduction in particle density (FIG. 7). To show that the removal of the particles was a function of charging the particles, in the subsequent experiment (FIG. 8), a pulsed bias was provided at the same time to eliminate the effective charging on the particles. As a result, there was effectively no reduction in particle density, which illustrates the successful non-contact removal effect that can be achieved through electrostatic charging of the polystyrene. Thus, it was shown that about 80% of these ~220 nm particles were removed by electrostatic repulsion for this configuration.

EXAMPLE B

I. Experiment Setup

The particle application to the samples for this experiment were the same as that for Example A, except that equal numbers of ~30 nm, ~80 nm, and ~220 nm particles were used in solution instead of entirely ~220 nm particles.

II. Experiment

For this experiment, a sample was exposed to a 2,000 W Ar plasma for ten minutes with a 10 mA constant bias on the sample. At the end of 10 minutes, the sample was flipped over before turning the plasma off to prevent re-adhesion of particles to the surface.

III. Results

Figure 9:
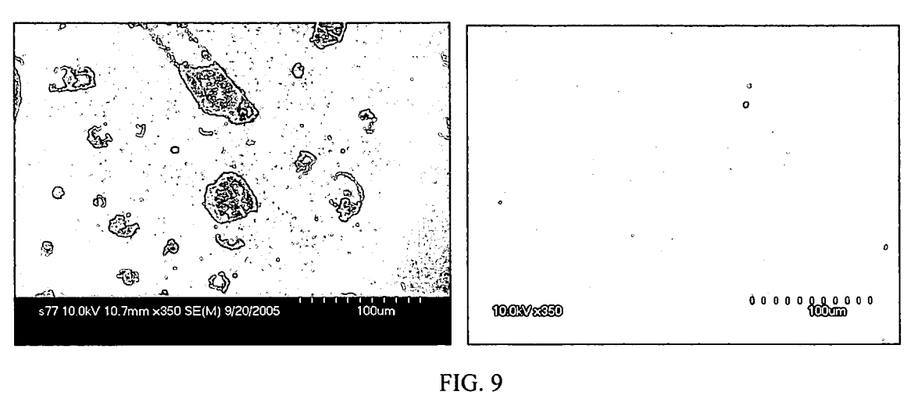
FIG. 9 shows SEM images of silicon wafers after exposure to a 2,000 W Ar plasma for 10 minutes with a 10 mA constant bias on the sample.

The visual results are compared in FIG. 9. The test sample (right image) compared to a control sample (left image) exhibits faint residue remaining at the edges of the clusters of particles removed.

EXAMPLE C

I. Experimental Setup

The particle application to the samples for this experiment were the same as that for Example B.

II. Experiment

For this experiment, a sample was exposed to a 2,000 W Ar plasma for ten minutes with 10 mA constant bias on the sample. The plasma was pulsed once a minute for 10 minutes, then the sample was flipped over before turning the plasma off again to lessen the likeliness of the re-adhesion of particles.

III. Results

Figure 10:
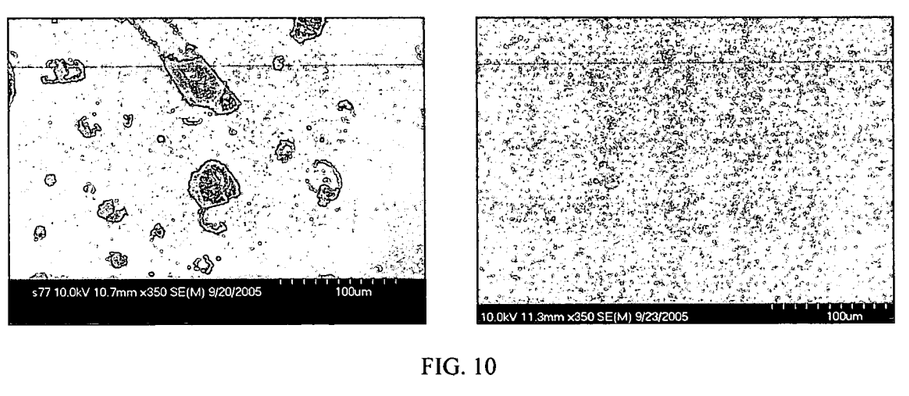
FIG. 10 shows SEM images of silicon wafers after exposure to a 2,000 W Ar plasma for 10 minutes, pulsed once a minute, with a 10 mA constant bias on the sample.
Figure 11:
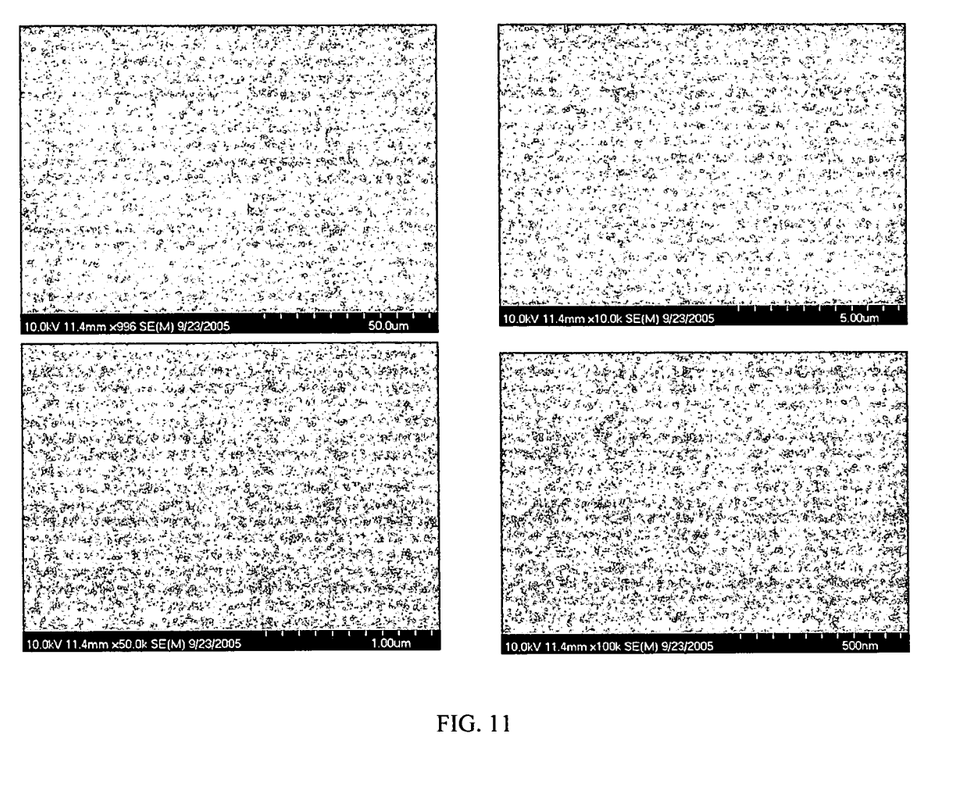
FIG. 11 shows SEM images associated with the test conditions of FIG. 10 magnified to illustrate removal of 30 nm and 80 nm particles.

The visual results of the control sample (left image) and the test sample (right image) are shown in FIG. 10. FIG. 11 illustrates the results at a higher magnification showing the removal of ~30 nm and ~80 nm particles. The test samples in FIGS. 10 and 11 show no particles present but slight chemical residue from the particle application process.

The present invention has been described with reference to specific embodiments, which are provided only for exemplification and are not to be construed as limiting the scope of the invention as defined by the following claims.

What is claimed is:

1. A method for removing contaminant particles from a surface, the method comprising:
   providing a chamber including:
      a plasma source electrically connected to a first power supply; and
      a sample electrically connected to a second power supply, the sample having a surface including contaminant particles to be removed;
   flowing inert gas into the chamber and across the surface of the sample;
   applying power to the plasma source using the first power supply so as to generate a plasma sheath in contact with the surface of the sample;
   applying an electrical bias to the sample using the second power supply while the surface of the sample is in contact with the plasma sheath;
   pulsing at least one of the plasma source and the electrical bias;
   creating a charge imbalance between the contaminant particles and the surface; and
   exposing the surface of the sample to the plasma sheath for a time duration sufficient to remove a substantial fraction of the contaminant particles therefrom without substantially removing sample surface material.

2. The method of claim 1, wherein one of the plasma source and the electrical bias is pulsed.

3. The method of claim 2, wherein the plasma source is pulsed.

4. The method of claim 2, wherein the electrical bias is pulsed.

5. The method of claim 1, wherein the pulsing comprises turning off the power produced by one of the first and second power supplies and reapplying the power produced by one of the first and second power supplies.

6. The method of claim 1, wherein the pulsing is carried out at a frequency of from a few hundred to about 200 kHz.

7. The method of claim 1, wherein the pulsing comprises a pulse length of from microseconds to milliseconds.

8. The method of claim 1, wherein the pulsing comprises a square wave pulse.

9. The method of claim 1, wherein the pulsing comprises a 50% duty cycle pulse.

10. The method of claim 1, wherein 2 kW of power are applied to the plasma source to generate the plasma.

11. The method of claim 1, wherein the electrical bias is a positive bias.

12. The method of claim 1, wherein the electrical bias is a negative bias.

13. The method of claim 1, wherein the electrical bias is applied at a 10 mA current.

14. The method of claim 1, wherein at least about 80% of the contaminant particles are removed from the surface.

15. The method of claim 1, wherein the surface of the sample is exposed to the plasma sheath for a time duration of 10 minutes.

16. The method of claim 1, wherein the inert gas is He.

17. The method of claim 1, wherein the surface is a surface employed in a lithography process.

18. The method of claim 17, wherein the surface is that of a semiconductor wafer.

19. The method of claim 17, wherein the surface is that of a mask.

* * * * *